United States Patent
Zimmermann

(10) Patent No.: US 12,027,638 B2
(45) Date of Patent: Jul. 2, 2024

(54) DUAL JUNCTION SOLAR CELL WITH LIGHT MANAGEMENT FEATURES FOR SPACE USE, A PHOTOVOLTAIC ASSEMBLY FOR SPACE USE INCLUDING A DUAL JUNCTION SOLAR CELL, A SATELLITE INCLUDING THE PHOTOVOLTAIC ASSEMBLY AND A METHOD FOR MANUFACTURING A DUAL JUNCTION SOLAR CELL FOR SPACE USE

(71) Applicant: Airbus Defence and Space GmbH, Taufkirchen (DE)

(72) Inventor: Claus Zimmermann, Munich (DE)

(73) Assignee: Airbus Defence and Space GmbH, Taufkirchen (DE)

( * ) Notice: Subject to any disclaimer, the term of this patent is extended or adjusted under 35 U.S.C. 154(b) by 0 days.

(21) Appl. No.: 18/159,736

(22) Filed: Jan. 26, 2023

(65) Prior Publication Data
US 2023/0307567 A1    Sep. 28, 2023

(30) Foreign Application Priority Data
Feb. 2, 2022  (EP) ...................... 22154730

(51) Int. Cl.
*H01L 31/054* (2014.01)
*H01L 31/0304* (2006.01)
(Continued)

(52) U.S. Cl.
CPC ...... *H01L 31/0547* (2014.12); *H01L 31/0304* (2013.01); *H01L 31/03046* (2013.01);
(Continued)

(58) Field of Classification Search
CPC ........... H01L 31/0304; H01L 31/03046; H01L 31/054; H01L 31/0547; H01L 31/056;
(Continued)

(56) References Cited

U.S. PATENT DOCUMENTS 4,419,533 A * 12/1983 Czubatyj ............... H01L 31/075
136/258
9,041,027 B2 5/2015 Ptak et al.
(Continued)

OTHER PUBLICATIONS

E. Yablonovitch, T. Gmitter, J. P. Harbison, and R. Bhat, "Extreme selectivity in the lift-off of epitaxial GaAs films", Appl. Phys. Lett. 51, 2222 (1987); https://doi.org/10.1063/1.98946.
(Continued)

*Primary Examiner* — Mayla Gonzalez Ramos
(74) *Attorney, Agent, or Firm* — Greer, Burns & Crain, Ltd.

(57) ABSTRACT

A photovoltaic assembly dual junction solar cell for space use including a solar cell stack including first and second subcells stacked on each other and each including an epitaxially grown light absorbing layer. The first subcell is adjacent to a solar cell stack front, light-receiving surface and the second subcell is adjacent to a solar cell stack rear surface. The first subcell light absorbing layer has a larger bandgap than the second subcell light absorbing layer. A light reflecting element positioned adjacent to a second subcell light absorbing layer rear side is configured to reflect photons having an energy smaller than the bandgap energy of the second subcell light absorbing layer and/or photons having an energy larger than the bandgap energy of the second subcell light absorbing layer and smaller than the bandgap energy of the first subcell light absorbing layer with a reflectivity of at least 90%.

13 Claims, 2 Drawing Sheets

(51) Int. Cl.
   *H01L 31/048* (2014.01)
   *H01L 31/0725* (2012.01)
   *H01L 31/18* (2006.01)

(52) U.S. Cl.
   CPC ...... *H01L 31/0725* (2013.01); *H01L 31/1844* (2013.01); *H01L 31/048* (2013.01); *H01L 31/1892* (2013.01)

(58) Field of Classification Search
   CPC . H01L 31/0687; H01L 31/18; H01L 31/1844; H01L 31/1892
   See application file for complete search history.

(56) References Cited

U.S. PATENT DOCUMENTS

| | | | | |
|---|---|---|---|---|
| 11,139,410 | B1* | 10/2021 | Zhang | H01L 31/0687 |
| 2009/0272430 | A1* | 11/2009 | Cornfeld | H01L 31/078 438/94 |
| 2010/0269897 | A1* | 10/2010 | Sakai | H01L 31/046 438/69 |
| 2014/0038392 | A1* | 2/2014 | Yonehara | H01L 33/0093 438/463 |
| 2021/0226078 | A1* | 7/2021 | Derkacs | H01L 31/0547 |
| 2021/0391493 | A1* | 12/2021 | Derkacs | H01L 31/078 |

OTHER PUBLICATIONS

Schermer, J. J., Mulder, P., Bauhuis, G. J., Voncken, M. M., van Deelen, J., Haverkamp, E. and Larsen, P. K. (2005), "Epitaxial Lift-Off for large area thin film III/V devices"; phys. stat. sol. (a), 202: 501-508; doi:10.1002/pssa.200460410.

S. W. Bedell et al., "Kerf-Less Removal of Si, Ge, and III-V Layers by Controlled Spalling to Enable Low-Cost PV Technologies," in IEEE Journal of Photovoltaics, vol. 2, No. 2, pp. 141-147, Apr. 2012; doi: 10.1109/JPHOTOV.2012.2184267.

Michel Bruel, Bernard Aspar and Andre-Jacques Auberton-Herve, Smart-Cut: A New Silicon On Insulator Material Technology Based on Hydrogen Implantation and Wafer Bonding. Japanese Journal of Applied Physics, vol. 36, Part 1, No. 3B.

C. Deguet et al., "Germanium-on-insulator (GeOI) structures realized by the Smart Cut/spl trade/ technology," 2004 EEE International SOI Conference (IEEE Cat. No.04CH37573), Charleston, SC, USA, 2004, pp. 96-97; doi: 10.1109/SOI.2004.1391571.

Yunjo Kim, et al, "Remote epitaxy through graphene enables two-dimensional material-based layer transfer", Nature 544, 340-343, 2017.

Sanghyun Park, John Simon, Kevin L. Schulte, Aaron J. Ptak, Jung-Sub Wi, David L. Young, Jihun Oh, "Germanium-on-Nothing for Epitaxial Liftoff of GaAs Solar Cells", Joule 7, 1782-1793, 2019.

R. Lang, J. Schön, F. Dimroth and D. Lackner, "Optimization of GaAs Solar Cell Performance and Growth Efficiency at MOVPE Growth Rates of 100 μm/h," in IEEE Journal of Photovoltaics, vol. 8, No. 6, pp. 1596-1600, Nov. 2018; doi: 10.1109/JPHOTOV.2018.2868021.

Metaferia, W., Schulte, K.L., Simon, J et al., "Gallium arsenide solar cells grown at rates exceeding 300 μm h—1 by hydride vapor phase epitaxy"; Nat Commun 10, 3361 (2019); doi:10.1038/s41467-019-11341-3.

European Search Report dated Jun. 23, 2022; priority document.

* cited by examiner

DUAL JUNCTION SOLAR CELL WITH LIGHT MANAGEMENT FEATURES FOR SPACE USE, A PHOTOVOLTAIC ASSEMBLY FOR SPACE USE INCLUDING A DUAL JUNCTION SOLAR CELL, A SATELLITE INCLUDING THE PHOTOVOLTAIC ASSEMBLY AND A METHOD FOR MANUFACTURING A DUAL JUNCTION SOLAR CELL FOR SPACE USE

CROSS-REFERENCES TO RELATED APPLICATIONS

This application claims the benefit of the European patent application No. 22154730.0 filed on Feb. 2, 2022, the entire disclosures of which are incorporated herein by way of reference.

FIELD OF THE INVENTION

The present application relates to a dual junction solar cell for space use, and, in particular, to a dual junction solar cell with light management features for space use. The present application also relates to a photovoltaic assembly including such a dual junction solar cell, a satellite including the photovoltaic assembly and a method for manufacturing such a dual junction solar cell. In addition, the present application relates to a use of the photovoltaic assembly in a space or nearspace environment.

BACKGROUND OF THE INVENTION

Known solar cells for space use are triple junction solar cells typically based on a III-V material system, such as a $Ga_{0.5}In_{0.5}P/GaAs$ stack grown epitaxially on a semiconductor wafer such as a germanium (Ge) wafer or a gallium arsenide (GaAs) wafer. By doping the Ge wafer by simultaneous diffusion during growth, a third pn junction, further to the first and second pn junctions in the $Ga_{0.5}In_{0.5}P/GaAs$ stack, is formed in Ge. The pn junctions of all three subcells are electrically connected in series. The first subcell is adjacent to a top, light-receiving surface of the solar cell and the third subcell formed by the Ge wafer is adjacent to a rear surface of the solar cell. The first, front subcell has a light absorbing layer with a higher bandgap energy than the bandgap energy of the light absorbing layer of the second, middle subcell, and the second subcell has a light absorbing layer with a higher bandgap energy than the bandgap energy of the light absorbing layer of the third subcell.

This "stacked bandgap configuration" has the effect that photons of an incoming light wave that are not absorbed in the first subcell because of having energies smaller than the bandgap energy of the first subcell can be absorbed in the succeeding second and/or third subcells. Likewise, photons that are not absorbed in the second subcell because of having energies smaller than the bandgap energy of the second subcell can be absorbed in the succeeding third subcell. This concept reduces thermalization losses and known triple junction solar cells may reach an efficiency of up to 30% under the air mass zero (AM0) sun spectrum in space.

For achieving an efficiency of up to 30%, known triple junction solar cells comprise complex light management features. An example of such a complex light management feature are multi-layer structures, such as Bragg reflectors, on the rear side of the most radiation sensitive subcell. In the above-described exemplary triple junction solar cell, the most radiation sensitive subcell is the GaAs subcell, i.e., the second subcell. The Bragg reflector at the rearside of the GaAs subcell acts in the wavelength range of about 750 nm to 875 nm, so that photons that are not absorbed in the second subcell after having passed once the second subcell can be back reflected into the second subcell for being absorbed in a second path through the subcell. Thus, the absorbance of the solar cell is increased by allowing the light a second pass through the cell. This again allows a reduction of the cell thickness while still collecting the same number of photons. Reducing the cell thickness results in an enhanced radiation resistance in space, where particle radiation decreases the diffusion length of the minority carriers thereby determining the maximum distance from the junction where the charge carriers are collected.

Typically, the triple junction cells are manufactured by means of a metal organic vapor phase epitaxy (MOVPE) process in reactors specifically configured for this process. The reactors represent a major capital investment in cell production and the depreciation of this investment is part of the cell production costs. The more complex the structures to deposit are, the greater the share of the reactor to the production costs is.

A further significant contribution to the cell production costs is accounted by the semiconductor wafers serving as a growth substrate. The semiconductor wafers, in the above example the Ge wafers, which are typically in 4 inch or 6 inch dimensions, are produced from a low defect density crystal, cut into the desired thickness of 100 to 300 μm, and specially polished on one side with a dedicated off-cut for a particular density of surface steps for nucleation and epitaxial growth of the cell layers to be deposited.

Summarizing, known triple junction solar cells for space use having an efficiency of up to 30% suffer from high production costs.

The technical problem underlying the present application is to overcome the problems related to known solar cells for space use.

In particular, a technical problem underlying the present application is to provide a solar cell which is adapted for space use and can be produced at low costs while having a high efficiency. A further technical problem underlying the present application is further to provide a manufacturing method for a solar cell which is cost-effective and results in a solar cell adapted for space use and having a high efficiency.

There is a need to overcome the problems related to known solar cells for space use.

SUMMARY OF THE INVENTION

According to the present application, a dual junction solar cell for a photovoltaic assembly for space use, a photovoltaic assembly for space use comprising a two-dimensional array of dual junction solar cells and a method of manufacturing a dual junction solar cell for space use are provided.

According to a first aspect of the present application, a dual junction solar cell for a photovoltaic assembly for space use is provided which comprises a solar cell stack comprising first and second subcells stacked on each other and each comprising an epitaxially grown light absorbing layer. The first subcell is adjacent to a front, light-receiving surface of the solar cell stack and the second subcell is adjacent to a rear surface of the solar cell stack. The light absorbing layer of the first subcell has a larger bandgap than the light absorbing layer of the second subcell. The dual junction solar cell also comprises a light reflecting element adjacent to a rear side of the light absorbing layer of the second subcell which is configured to reflect photons having an energy smaller than the bandgap energy of the light absorbing layer of the second subcell with a reflectivity of at least 90%, preferably at least 95%, and more preferably at least 99%.

The dual junction solar cell is a stacked configuration of two subcells, which may be separated by one or more tunnel junction layers disposed between the first and second subcells electrically connecting the first and second subcells. The light absorbing layers of the first and second subcells may be semiconductor layers, in particular III-V compound semiconductor layers. As the notation "dual junction solar cell" implies, each subcell comprises a junction. The junction may be a homojunction or a heterojunction. The light absorbing layers may form part of the respective junction. The junction may further comprise an emitter layer, and the light absorbing layer may be a base layer. Each or a subcell may further comprise a back surface field layer for increased carrier collection. The first and/or the second subcell may comprise one or more window layers for surface passivation.

The solar cell stack may comprise one or more anti-reflective layers forming the front surface of the solar cell stack. The solar cell stack may further comprise front and rear side contact layers. In particular, the front side contact layer may be adjacent to the first subcell and the rear side contact layer may be adjacent to the second subcell.

The light absorbing layers of the first and second subcells are epitaxially grown layers, i.e., epitaxial layers. Thus, the light absorbing layers are not provided by a wafer (i.e., a substrate), but are grown layers on a wafer (i.e., substrate). Also, other layers forming part of the first and second subcells and the solar cell stack may be epitaxially grown layers. The substrate on which the first and second subcells has been grown has been removed after the growth and does not form part of the dual junction solar cell. Or, in other words, the dual junction solar cell does not comprise a semiconductor wafer on which the light absorbing layers have been epitaxially grown.

The light reflecting element may be directly provided on a rear surface of the light absorbing layer or of any of the layers of the second subcell which are located on a rear side of the light absorbing layer. In particular, the light reflecting element may be provided before providing a rear side contact of the solar cell stack. Thus, for example, if the second subcell comprises a back surface field layer, the light reflecting element may be located adjacent to a rear surface of the back surface field layer and may also directly contact the rear surface of the back surface field layer. In the alternative, the light reflecting element may be also disposed between the light absorbing layer and the back surface field layer. The light reflecting element may be provided adjacent to the whole rear side of the light absorbing layer of the second subcell so as to extend over the whole rear side. The light reflecting element may be or comprise a light reflecting layer, in particular a planar light reflecting layer.

The light reflecting element is configured, in particular due to the material of the light reflecting element and the shape of the light reflecting element, to reflect photons having an energy smaller than the bandgap energy of the light absorbing layer of the second subcell, for which the light absorbing layer of the second subcell is transparent or substantially transparent. In particular, the light reflecting element may be configured to reflect photons that have an energy directly below the bandgap energy of the light absorbing layer of the second subcell, in particular, within a defined energy range below the bandgap energy. Thus, photons that may be absorbed in the third subcell of known triple junction solar cells may be back reflected out of the solar cell by means of the light reflecting element.

For example, in the case of GaAs for the material of the light absorbing layer of the second subcell, which has a bandgap energy of 1.42 eV, the light reflecting element is configured to reflect photons having an energy smaller than 1.42 eV with a high reflectivity (i.e., more than 90%). Thus, for example, the light reflecting element may be configured to reflect photons having an energy smaller than 1.42 eV and larger than 0.7 eV with a high reflectivity, or photons having an energy smaller than 1.42 eV and larger than 1.0 eV with a high reflectivity. Thus, the light reflecting element may be configured to reflect infrared light with a high reflectivity.

In an embodiment of the first aspect, the light reflecting element is configured to reflect photons having an energy larger than the bandgap energy of the light absorbing layer of the second subcell with a reflectivity of at least 90%, preferably at least 95%, and more preferably at least 99%. Thus, in this embodiment, the light reflecting element may be also configured to reflect photons having an energy within one or more energy ranges of energies larger than the bandgap energy of the light absorbing layer of the second subcell with a high reflectivity. Hence, also photons that may be absorbed by the light absorbing layer of the second subcell may be reflected with a high reflectivity by the light reflecting element. The light reflecting element may be configured as a single light reflecting element, or as more than one light reflecting element. For example, the light reflecting element may be configured as a single light reflecting layer made of a material having the claimed reflectivity, or of two or more light reflecting layers made of different materials so as to achieve in combination the claimed reflectivity.

For example, in the case of GaAs for the material of the light absorbing layer of the second subcell, which has a bandgap energy of 1.42 eV, the light reflecting element is configured to reflect photons having an energy larger than 1.42 eV with a high reflectivity (i.e., more than 90%). Thus, the light reflecting element may be configured to also reflect visible light with a high reflectivity. For example, the light reflecting element may be configured to reflect photons having an energy between 1.42 eV and 3 eV with a high reflectivity, or the light reflecting element may be configured to reflect photons having an energy between 1.42 eV and 1.9 eV with a high reflectivity.

In an implementation of the embodiment of the first aspect, the light reflecting element is configured to reflect photons having an energy larger than the bandgap energy of the light absorbing layer of the second subcell and smaller than the bandgap energy of the light absorbing layer of the first subcell with a reflectivity of at least 90%, preferably at least 95%, and more preferably at least 99%. Hence, in this embodiment, also photons that may be absorbed by the light absorbing layer of the second subcell and for which the first subcell is substantially transparent may be reflected with a high reflectivity by the light reflecting element.

In a further embodiment of the first aspect, the light reflecting element is a metal layer adjacent to the rear surface of the second subcell, in particular, a planar metal layer. The metal layer may act as a metallic mirror for photons having an energy as claimed. The metal layer may be formed by a deposition process. The metal layer may be formed by a same deposition process as the light absorbing layers of the first and second subcells, or, in the alternative, may be also formed by a different deposition process. In an example, the light absorbing layers are formed by a MOVPE (metal organic vapor phase epitaxy) process, and the metal layer is formed by a MOVPE process or a CVD process, e.g., by sputtering.

According to a second aspect of the present application, a dual junction solar cell for a photovoltaic assembly for space use is provided which comprises a solar cell stack comprising first and second subcells stacked on each other and each comprising an epitaxially grown light absorbing layer. The first subcell is adjacent to a front, light-receiving surface of the solar cell stack and the second subcell is adjacent to a rear surface of the solar cell stack. The light absorbing layer of the first subcell has a larger bandgap than the light absorbing layer of the second subcell. The dual junction solar cell further comprises a light reflecting element adjacent to a rear side of the light absorbing layer of the second subcell which is configured to reflect photons having an energy larger than the bandgap energy of the light absorbing layer of the second subcell and smaller than the bandgap energy of the light absorbing layer of the first subcell with a reflectivity of at least 90%, preferably at least 95%, and more preferably at least 99%.

The first and second subcells of the dual junction solar cell according to the second aspect may be configured the same as the first and second subcells as described with respect to the dual junction solar cell according to the first aspect. Furthermore, the solar cell stack may comprise the same additional layers as described with respect to the solar cell stack according to the first aspect.

The light reflecting element of the dual junction solar cell according to the second aspect may have the same position within the dual junction solar cell relative to the other layers and/or elements as described with respect to the light reflecting element of the dual junction solar cell of the first aspect.

The light reflecting element is configured to reflect photons that may be absorbed in the second subcell and for which the first subcell is transparent or substantially transparent with a high reflectivity. The light reflecting element may be configured so as to reflect all photons having an energy within the claimed range with a high reflectivity. The light reflecting element may be also configured so as to reflect photons within a relatively narrow energy range included in the claimed energy range with a high reflectivity. In an implementation, the narrow energy range corresponds to a single energy within the claimed energy range.

In an embodiment of the second aspect, the light reflecting element has a planar surface. The planar surface may be configured so that normally incident light is ideally reflected, i.e., with a normal (perpendicular) angle. The light reflecting element may be a light reflecting layer as in the first aspect. The light reflecting element may be a suitable single metal layer. The light reflecting element may be manufactured as described with respect to the light reflecting element in the dual junction solar cell according to the first aspect.

In an alternative embodiment of the second aspect, the light reflecting element has a surface which comprises three-dimensional structures which are configured to reflect normally incident light at an off normal angle. Normally incident light may be light that has a perpendicular, i.e., normal, incident angle with respect to the front surface of the solar cell stack. The normally incident light may be back reflected at a different angle from the normally incident incidence angle. The three-dimensional structures may be very small structures, for example microstructures or nanostructures. The three-dimensional structures may be provided adjacent to the whole rear surface of the second subcell. The three-dimensional structures may be regularly spaced from each other and/or may be regularly configured. The three-dimensional structures may have an oblique surface which is inclined with respect to the front surface of the solar cell stack. The three-dimensional structures are made of a material suitable to reflect photons having an energy larger than the bandgap energy of the light absorbing layer of the second subcell and smaller than the bandgap energy of the light absorbing layer of the first subcell with a reflectivity of at least 90%, preferably at least 95%, and more preferably at least 99%.

In an implementation of the alternative embodiment of the second aspect, the three-dimensional structures are configured to reflect normally incident light at an off normal angle back into the solar cell stack so that the light is totally reflected at the front surface of the solar cell stack or at an interface adjacent to the front surface of the solar cell stack. In particular, the dimensions and orientation of the three-dimensional structures may be chosen so that normally incident light is reflected at an off normal angle back into the solar cell stack so that the light is totally reflected at the front surface of the solar cell stack or at an interface adjacent to the front surface of the solar cell stack. In that way, the non-absorbed and reflected light may propagate three and four times, and even more times, through the solar cell stack.

In a further implementation of the alternative embodiment of the second aspect, the light reflecting element is an asymmetric grating having a configuration and an orientation which are chosen such that the reflection maximum is at an angle that the reflected light is totally reflected at the front surface of the solar cell stack or at an interface adjacent to the front surface of the solar cell stack. The asymmetric grating may be a blazed grating. The asymmetric grating may have three-dimensional, step-like structures at which the incident light is reflected. The asymmetric grating may be optimized for light having a wavelength close to the bandgap energy of the light absorbing layer of the second subcell. Thus, light having a wavelength close to the bandgap energy of the light absorbing layer of the second subcell is constructively interfered when being reflected and with a sufficiently large angle at which the light is totally reflected at the front of the solar cell.

In the embodiments and implementations of the first and second aspects, the first subcell may have a thickness of 100 to 1000 nm, in particular of 200 to 700 nm, and most in particular of 300 nm to 500 nm, and the second subcell may have a thickness of 500 to 5000 nm, in particular of 1000 to 4000 nm, and most in particular of 1000 to 2000 nm. Relatively thin first and second subcells may provide the advantage of an increased radiation hardness of the respective subcell when used in space. Furthermore, relatively thin first and second subcells are cheaper in production compared to relatively thick first and second subcells due to the shorter residence time in the dedicated reactors needed to manufacture the first and second subcells.

In the embodiments and implementations of the first and second aspects, the light absorbing layer of the first subcell may comprise GaInP, and the light absorbing layer of the second subcell may comprise GaInAs or GaAs. In the example of GaAs for the light absorbing layer of the second subcell, the bandgap energy corresponds to about 1.42 eV. Thus, in this example, light with a wavelength up to 875 nm may be absorbed in the second subcell. Hence, in the embodiment where the light reflecting element is configured to reflect photons having an energy smaller than the bandgap energy of the light absorbing layer of the second subcell, the reflected light may have a wavelength longer than 875 nm.

In particular, light in a wavelength range between 875 nm to 1800 nm (and optionally also beyond 1800 nm) may be reflected by the light reflecting element with a high reflectivity. In the embodiment where the light reflecting element is configured to reflect photons having an energy larger than the bandgap energy of the light absorbing layer of the second subcell and smaller than the bandgap energy of the light absorbing layer of the first subcell with a reflectivity of at least 90%, the reflected light may be light having a wavelength between 650 nm to 875 nm. In the embodiment where the light reflecting element comprises the three-dimensional backreflecting structures, in the GaAs example, light with a wavelength of 875 nm may be reflected by the light reflecting element.

According to a third aspect, a photovoltaic assembly for space use is provided which comprises a plurality of dual junction solar cells according to the first or second aspects which are arranged in a two-dimensional array and electrically connected to each other. The assembly further comprises a support structure carrying the two-dimensional array of dual junction solar cells, and a covering assembly covering a light receiving side of the two-dimensional array. The support structure and the covering assembly may be bonded a back side and a front side of the two-dimensional array, respectively, by means of an adhesive. The covering assembly may comprise a plurality of different layers, for example a coverglass provided with an anti-reflective coating. Laterally, the two-dimensional array may be enclosed by a frame structure.

In an embodiment of the third aspect, when the dual junction solar cell comprises a light reflecting element which comprises three-dimensional structures that are configured to reflect normally incident light at an off normal angle back into the solar cell stack so that the light is totally reflected, the reflected light may be totally reflected at an interface of the covering assembly. In particular, the interface at which the light is totally reflected may be one of the interfaces between the plurality of different layers that the covering assembly may comprise.

According to a fourth aspect, the photovoltaic assembly may be used in a space or nearspace environment, in particular in an environment located 20 km or more above the Earth surface.

According to a fifth aspect, a satellite is provided which comprises a photovoltaic assembly with a plurality of dual junction solar cells according to the first or second aspects. In this fifth aspect, the photovoltaic assembly may be used as a power supply for the satellite. In particular, the described photovoltaic assembly may be a cost-effective, efficient and reliable power supply for the satellite used in space.

According to a sixth aspect, a method for manufacturing a dual junction solar cell is provided which comprises the steps of providing a semiconductor substrate, depositing a first subcell having a light absorbing layer on the semiconductor substrate, depositing a second subcell having a light absorbing layer on the first subcell, wherein the light absorbing layer of the first subcell has a larger bandgap than the light absorbing layer of the second subcell, and depositing or providing a light reflecting element adjacent to a rear side of the light absorbing layer of the second subcell which is configured to reflect photons having an energy smaller than the bandgap energy of the light absorbing layer of the second subcell with a reflectivity of at least 90%, preferably at least 95%, and more preferably at least 99% second subcell, and/or configured to reflect photons having an energy larger than the bandgap energy of the light absorbing layer of the second subcell and smaller than the bandgap energy of the light absorbing layer of the first subcell with a reflectivity of at least 90%, preferably at least 95%, and more preferably at least 99%. The method further comprises the step of removing the semiconductor substrate from the first subcell.

Thus, with the method, any of the dual junction solar cells according to the first and second aspects may be provided.

The steps may be performed in a chronological order as described, but may be also performed in a different chronological order. In an embodiment, the first subcell may be deposited before deposition of the second subcell.

In an embodiment of the method, the step of providing the crystalline semiconductor substrate may include removing the semiconductor substrate from another first subcell during manufacturing of another dual junction solar cell and reusing the removed semiconductor substrate.

In a further embodiment of the method, the first subcell and the second subcell and optionally the light reflecting layer, may be deposited with a deposition rate of 1 µm/h to 300 µm/h, in particular of 5 µm/h to 300 µm/h, and most in particular of 10 µm/h to 300 µm/h by MOVPE or HYPE.

Even if some of the aspects described above and below have been described in reference to a dual junction solar cell alone, these aspects may also apply to the dual junction solar cell integrated into a photovoltaic assembly.

BRIEF DESCRIPTION OF THE DRAWINGS

Other objects, features, advantages and applications will become apparent from the following description of non-limiting embodiments regarding the accompanying drawings. In the drawings, all described and/or illustrated features, alone or in any combination form the subject matter disclosed therein, irrespective of their grouping in the claims or their relations/references. The dimensions and proportions of components or parts shown in the figures are not necessarily to scale; these dimensions and proportions may differ from illustrations in the figures and implemented embodiments.

DETAILED DESCRIPTION OF THE PREFERRED EMBODIMENTS

The variants of the functional and operational aspects, as well as their functional and operational aspects described herein, are only for a better understanding of its structure, its functions and properties; they do not limit the disclosure to the embodiments. The figures are partially schematic, the essential properties and effects are clearly shown enlarged or scaled down in part to clarify the functions, active principles, embodiments and technical characteristics. Every operation, every principle, every technical aspect and every feature that/which is disclosed in the figures or in the text is/can be combined with all claims, each feature in the text and the other figures, other modes of operation, principles, technical refinements and features that are included in this disclosure, or result from it, so that all possible combinations are assigned to the devices and methods described. They also include combinations of all individual comments in the text, that is, in each section of the description, in the claims and combinations between different variations in the text, in the claims and in the figures, and can be made to subject-matter of further claims. The claims do not limit the disclosure and therefore the possible combinations of all identified characteristics among themselves. All features disclosed are explicitly also individually and in combination with all other features disclosed herein.

In the following, without being restricted thereto, specific details are set forth to provide a thorough understanding of the present disclosure. However, it is clear to the skilled person that the present disclosure may be used in other embodiments, which may differ from the details set out below.

Typical solar arrays for space missions comprise a plurality of photovoltaic assemblies oriented relative to each other and towards the sun by means of mechanical support elements. The mechanical support elements may comprise hinges, yokes, support structures and similar structures for providing all required functions from extending the solar arrays from a stowed to a deployed configuration and changing their orientation towards the sun.

Figure 1:
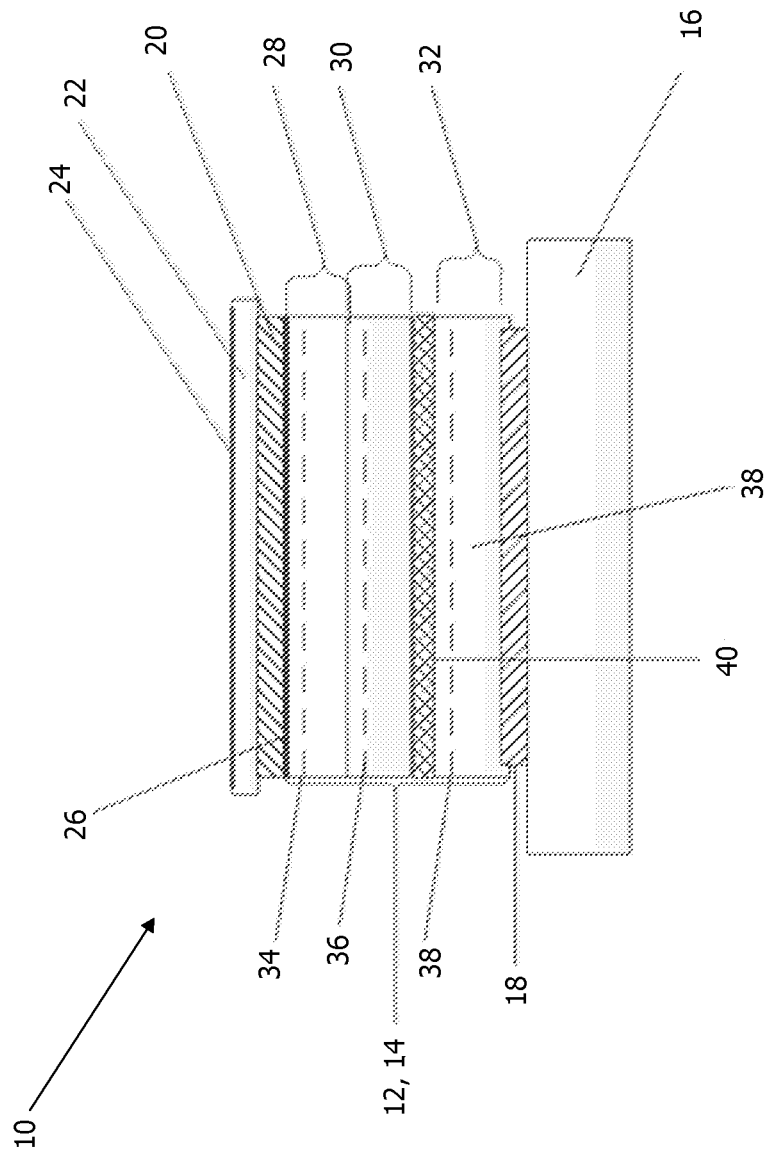
FIG. 1 shows a schematic cross-sectional illustration of a known photovoltaic assembly including a plurality of triple junction solar cells.

FIG. 1 schematically shows a conventional photovoltaic assembly 10 adapted for being used in a solar array for space use in cross-section. The photovoltaic assembly 10 includes a solar cell module 12, which is a two-dimensional arrangement of solar cells 14 electrically connected with each other, a support structure 16 and additional layers covering the solar cell module 12 and providing a mechanical connection between the solar cell module 12 and the support structure 16.

The support structure 16 may mechanically support the solar cell module 12. Exemplary configurations include a relatively thin Kapton or Kevlar blanket with a typical thickness of about 100 µm as well as relatively thick carbon fiber faceskin/aluminum (Al) honeycomb core sandwich panels with may have a typical thickness of several centimeters.

An adhesive layer 18 is provided on the support structure 16 between the support structure 16 and the solar cell module 12 which is configured to bond the solar cell module 12 to the support structure 16. The adhesive layer 18 may be composed of silicone, for example, and may have a thickness of 10 µm to 200 µm.

A further adhesive transparent layer 20 is provided on top of the solar cell module 12 which is configured to attach a protective layer 22 on top of the solar cell module 12. The further adhesive transparent layer 20 may also be a silicone layer and may have a thickness from 5 µm to 100 µm. The protective layer 22 should be transparent for the light which is absorbed by the light absorbing layers of the first to third subcells of the triple junction solar cells 14 (and which will be described below). For example, the protective layer 22 may be a coverglass formed of borosilicate glass doped with cerium (Ce) having a thickness between 50 µm to 500 µm. The protective layer 22 is configured to provide protection from the radiation environment in space.

On top of the protective layer 22, an anti-reflective coating 24 may be provided, for example a λ/4 MgF2 (magnesium fluoride) coating.

A typical solar cell 14 of the solar cell module 12 includes a stacked configuration of individual solar cells, i.e., a plurality of individual subcells each having a light absorbing layer and stacked over each other in a height direction of the photovoltaic assembly. On top of the stacked configuration of individual solar cells, a further anti-reflection coating 26 is provided for minimizing reflection losses. The anti-reflection coating 26 may comprise a dual layer coating of aluminum oxide/titanium oxide, for example.

For space use, typical solar cells 14 are triple junction solar cells which each comprise a stacked configuration of three subcells. A first subcell 28 is adjacent to a top, light-receiving surface of the solar cell 14, a second subcell 30 is located underneath the first subcell 28 and a third subcell 32 is located underneath the second subcell 30 and adjacent to a rear surface of the solar cell 14. The first, front subcell 28 has a light absorbing layer 34 having a higher bandgap energy than the bandgap energy of a light absorbing layer 36 of the second, middle subcell 30, and the light absorbing layer 36 of the second subcell 30 has a higher bandgap energy than the bandgap energy of a light absorbing layer 38 of the third subcell 32.

This "stacked bandgap configuration" has the effect that photons of an incoming light wave that are not absorbed in the first subcell 28 because of having energies smaller than the bandgap energy of the first subcell 28 can be absorbed in the succeeding second and/or third subcells 30, 32. Likewise, photons that are not absorbed in the second subcell 30 because of having energies smaller than the bandgap energy of the second subcell 30 can be absorbed in the succeeding third subcell 32.

The third subcell 32 is typically formed by a single crystalline semiconductor wafer, for example a germanium (Ge) wafer. The pn junction in the semiconductor wafer may be formed by doping the Ge wafer by simultaneous diffusion during growth. The pn junction is schematically illustrated by a dashed line within the third subcell 32. A typical thickness of the single crystalline semiconductor wafer is from 50 µm to 250 µm. The second subcell 30 comprises a doped semiconductor layer formed on the single crystalline semiconductor wafer. The doped semiconductor layer of the second subcell 30 forms the light absorbing layer 36. The second subcell 30 is typically formed by epitaxial growth on the semiconductor wafer. In the present example, the doped semiconductor layer is formed of gallium arsenide (GaAs), and may contain approximately 1% indium (In) for better lattice matching with the subjacent Ge wafer. Typical thicknesses of the second subcell 30 are between 1000 nm to 4000 nm. The top, first subcell 28 also comprises a doped semiconductor layer as the light absorbing layer 34 and is epitaxially grown on the second subcell 30. In the present example, the light absorbing layer 34 is formed of GaInP, in particular of $Ga_{0.5}In_{0.5}P$, and a typical thickness of the first subcell 28 ranges from 100 nm to 1000 nm.

The first and second subcells 28, 30 also each comprise a pn junction schematically illustrated by a dashed line. The pn junctions may be formed by the same semiconductor layer as the respective light absorbing layers 34, 36 and by doping the respective semiconductor layer with a doping type opposite to that of the respective light absorbing layer 34, 36. In the alternative, the pn junctions may be formed by a different semiconductor layer than the respective semiconductor layer of the light absorbing layers 34, 36.

The pn junctions are located close to the light-receiving side of the solar cell 14, typically at 10% of the entire subcell thickness, thereby enhancing radiation hardness in space.

The exemplary photovoltaic assembly of FIG. 1 further comprises a reflecting structure 40 on the rear side of the second subcell 30, i.e., between the third and second subcells 32, 30. The reflecting structure 40 is configured so as to be reflective for light that may be absorbed by the second subcell 30, thereby allowing non-absorbed photons to again pass the second subcell 30 and being absorbed. In that way, the thickness of the second subcell 30 may be reduced while still allowing the same number of photons to be absorbed thereby enhancing the radiation hardness in space.

Typically, the reflecting structure 40 requires a complex structure of multiple stacked layers. For example, the reflecting structure 40 may be a Bragg reflector comprising multiple stacked layers of dielectric materials with different refractive indices.

Such triple junction solar cells 14 in the above described environment may reach an efficiency of up to 30% under the air mass zero (AM0) sun spectrum in space. However, they are very cost-intensive in production. The solar cells 14 are grown by metal organic vapor phase epitaxy (MOVPE) in dedicated reactors which account for a significant part of the production costs due to the complex structure of the triple junction solar cells 14. Furthermore, the low defect semiconductor substrate specially prepared for being used as a growth template suffers from high manufacturing costs.

Figure 2:
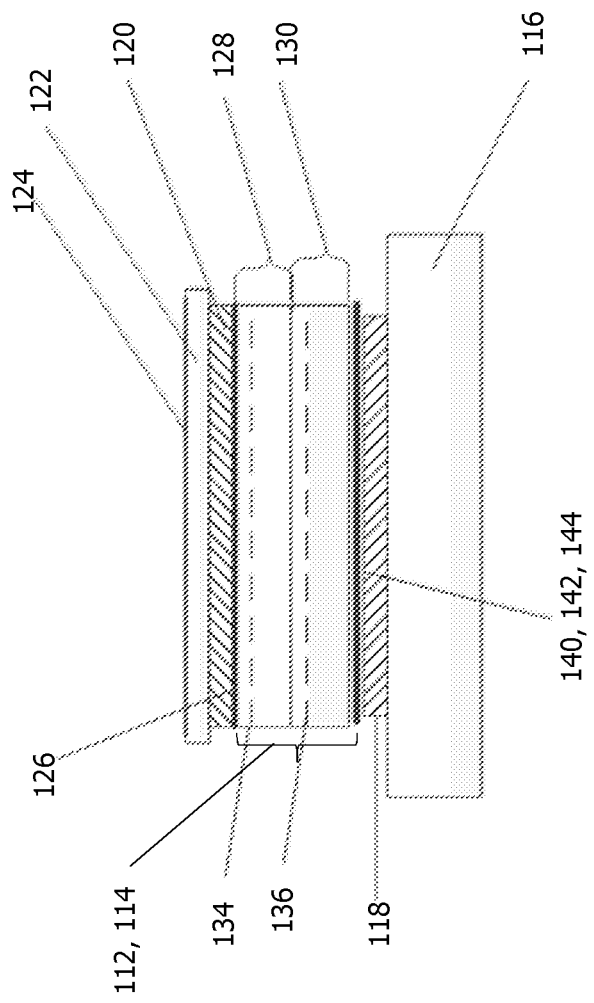
FIG. 2 shows a schematic cross-sectional illustration of a photovoltaic assembly according to an embodiment of the present invention including a plurality of dual junction solar cells according to an embodiment of the invention.

FIG. 2 shows a photovoltaic assembly 110 for space use according to a first embodiment of the present invention. The photovoltaic assembly 110 includes a dual junction solar cell 114 according to a first embodiment of the invention.

Like the conventional photovoltaic assembly 10 of FIG. 1, the exemplary photovoltaic assembly 110 according to the first embodiment of FIG. 2 includes a solar cell module 112, i.e., a two-dimensional arrangement of solar cells 114 electrically connected with each other, a support structure 116 and additional layers covering the solar cell module 112 and providing a mechanical connection between the solar cell module 112 and the support structure 116.

The support structure 116 may be configured as the support structure 116 described with respect to FIG. 1. In addition, the additional layers may be an anti-reflective coating 124, a protective layer 122, an upper transparent adhesive layer 120 and a lower adhesive layer 118 and may be configured as the respective layers 24, 22, 20, 18 described with respect to FIG. 1.

However, an individual solar cell 114 of the two-dimensional arrangement of solar cells 112 is differently configured in the photovoltaic assembly of FIG. 2 than in that of FIG. 1. In particular, the individual solar cell 14 in the conventional photovoltaic assembly 10 is typically a triple junction solar cell with a complex light reflecting structure 40 such as the Bragg reflector underneath the second subcell 30 as illustrated in FIG. 1 in order to provide a high efficiency solar cell adapted to be used in photovoltaic assemblies for space use.

By contrast, the individual solar cell of the photovoltaic assembly of FIG. 2 is a dual junction solar cell 114 which comprises a first subcell 128 with a light absorbing layer 134 and a second subcell 130 with a light absorbing layer 136. The bandgap of the light absorbing layer 134 of the first subcell 128 is larger than the bandgap of the light absorbing layer 136 of the second subcell 130. Thus, some of the photons having not enough energy to be absorbed in the first subcell 128 may be absorbed in light absorbing layer 136 of the second subcell 130. The dual junction solar cell is preferably based on a group III-V material system.

In particular, the first subcell 128 of FIG. 2 may be configured as the first subcell 28 of FIG. 1, and the second subcell 130 of FIG. 2 may be configured as the second subcell 30 of FIG. 1. Thus, the light absorbing layer 136 of the second subcell 30 may be a doped gallium arsenide (GaAs) layer, and may contain approximately 1% indium (In) for better lattice matching. Typical thicknesses of the second subcell 130 are between 1000 nm to 4000 nm. The light absorbing layer 134 of the top, first subcell 128 may be a doped GaInP layer, in particular $Ga_{0.5}In_{0.5}P$ layer, and a typical thickness of the first subcell 128 ranges from 100 nm to 1000 nm.

Unlike the triple junction solar cell of FIG. 1, the dual junction solar cell 114 of FIG. 2 does not comprise the third subcell 32, which is the semiconductor wafer, in particular a Ge wafer, with the diffused pn junction serving as a growth template for the second subcell, since the semiconductor substrate has been removed after forming the first and second subcells on the semiconductor substrate. Thus, for manufacturing the dual junction solar cell 114 of FIG. 2, the dual junction solar cell 114 with the first and second subcells 128, 130 is deposited on a semiconductor substrate such as a single crystalline Ge wafer, which is pre-treated for deposition of the first and second subcells 128, 130. The pre-treatment may encompass polishing the wafer on one side for nucleation and epitaxial growth of the first and second subcells 128, 130, in particular polishing the one side with a dedicated off-cut for a particular density of surface steps. After deposition of the first and second subcells 128, 130, the semiconductor substrate is removed. The removed substrate may be re-used in a next deposition process for manufacturing a dual junction solar cell, with only minimal surface preparation steps before the re-use. Thus, in a manufacturing process of a dual junction solar cell 114 according to the present invention, the substrate used for the epitaxial growth of the first and second subcells may be a substrate already used in a preceding manufacturing process.

Further unlike the triple junction solar cell 14 of FIG. 1, the dual junction solar cell 114 of FIG. 2 does not comprise a complex light reflecting structure as, for example, a Bragg reflector configured so as to be reflective for light that may be absorbed by the second subcell, i.e., for photons having a bandgap energy larger than the bandgap energy of the light absorbing layer of the second subcell.

Instead, as is also illustrated in FIG. 2, the dual junction solar cell 114 comprises a light reflecting structure 140 on the rear surface of the second subcell 30 adjacent to the rear surface of the dual junction solar cell 114 which is configured to reflect photons having an energy smaller than the bandgap energy of the light absorbing layer 136 of the second subcell 130. Thus, the light reflecting structure 140 may be a simple metal reflecting structure with a metal having a high reflectivity for photons having an energy smaller than the bandgap energy of the light absorbing layer 136 of the second subcell 130. The reflectivity should be at least 90%, preferably at least 95%, and more preferably at least 99% for photons having an energy smaller than the bandgap energy of the light absorbing layer 136 of the second subcell 130.

In the example of FIG. 2, the light absorbing layer 136 of the second subcell 130 is a doped GaAs layer (optionally with 1% In). GaAs has a bandgap energy of 1.42 eV, so that photons may be absorbed in the second subcell 130 that have an energy of 1.42 eV and more, which corresponds to light with a wavelength of about 875 nm or less. Light with a wavelength of 875 nm or more, i.e., photons that have an energy less than 1.42 eV, is not absorbed in the second subcell 130, and also not in the first subcell 128 having a still higher bandgap energy than the second subcell 130. Thus, the light reflecting structure 140 is configured to reflect photons that have an energy less than 1.42 eV with a high reflectivity. This may be realized by a metallic mirror with a suitably chosen metal having a high reflectivity in the wavelength range from 875 nm up to 1800 nm and optionally also beyond. An example for a suitable metal having a reflectivity of more than 98% in the discussed wavelength range is gold (Au). Another example is silver (Ag), which has a reflectivity of more than 95% in the discussed wavelength range.

Thus, light in a wavelength range that is absorbed by the third subcell 32 in the triple junction solar cell 14 of FIG. 1 is reflected by the light reflecting structure 140 back into the solar cell 114 and out of the solar cell 114, since the first and second subcells 128, 130 are transparent for the light in this wavelength range. This results in a reduced operating temperature in space of the photovoltaic assembly 110 comprising a plurality of the described dual junction solar cells 114, as will be explained in the following.

In particular, the dual junction solar cell 114 of the photovoltaic assembly 110 of FIG. 2 has an efficiency reduced by 10% compared to the efficiency of the triple junction solar cell 14 of the photovoltaic assembly 10 of FIG. 1, under reference conditions of 25° C. and 1 AM0 solar constant. This is due to the removed semiconductor substrate, in particular the removed Ge substrate, having the additional pn junction contributing to about 10% to the overall solar cell performance.

However, under operating conditions in space of the photovoltaic assembly of FIG. 2, the operating temperature of the dual junction solar cell 114 integrated into the photovoltaic assembly 110 can be reduced by many degrees Celsius compared to the triple junction solar cell 14 integrated in the photovoltaic assembly 10 as shown in FIG. 1. The operating temperature can be reduced since the long wavelength light that is absorbed by the light absorbing layer 38 of the third subcell 32 in the known triple junction solar cell 14 is reflected back out of the cell 114 by means of the above-described light reflecting element 140 at the rear side of the second subcell 130. The operating temperature of the solar cell 114 affects the open circuit voltage of the solar cell 114 in the way that the open circuit voltage is reduced with rising operating temperature. This reduced operating temperature of the dual junction solar cell 114 effects that the loss in open circuit voltage and thus in efficiency due to the removed third subcell is substantially compensated with due to the lower reduction of the open circuit voltage due to the lower operating temperature.

Consequently, a much simpler solar cell structure that is cheaper in production costs than the state of art solar cell structure (which will be explained below with reference to an exemplary method for manufacturing the dual junction solar cell) explained with respect to the photovoltaic assembly of FIG. 1 can be operated at almost the same efficiency.

In the following, the reduced operating temperature resulting in an enhanced efficiency shall be described quantitatively.

Usually, when operating the photovoltaic assemblies with the two-dimensional solar cell array, the support structure and the additional layers in space, they are not actively temperature controlled. The temperature of the photovoltaic assembly and thus the operating temperature of the respective solar cell integrated into the photovoltaic assembly is established as a heat balance between the incoming absorbed solar flux, the power extracted electrically from the cell and the heat emitted by radiation at the coverglass 22 front side and the supporting structure 16 rear side. Assuming for simplicity the case of a thin blanket with very high thermal conductivity λ from the front to the rear side, the solar cell operating temperature T is calculated as $$T = \sqrt[4]{\frac{\Phi_0 \alpha_{cell}(1-\eta)}{(\epsilon_{rear} + \epsilon_{cover})\sigma}}$$

In this formula, $\Phi_0$ denotes the incoming solar flux, taken as 1367 W/m$^2$, and $\alpha_{cell}$ is the solar absorbance of the cell, calculated by integrating the wavelength dependent absorbance with the Planck spectrum of the sun, divided by the incoming solar flux. The wavelength dependent absorbance can be approximated by the external quantum efficiency of the cell. For known triple junction cells, the external quantum efficiency is >90% from 350 nm up to 1800 nm (which is the absorption limit of the Ge substrate), resulting in $\alpha_{cell}$ of 0.9. η describes the electrical efficiency of the cell, i.e., the electrical power produced per unit area relative to the incoming solar flux. For state of the art photovoltaic assemblies with the triple junction cells, η is approximately 30%. $\epsilon_{rear}$ and $\epsilon_{cover}$ denote the emissivity of the supporting structure 16 and of the coverglass 22, respectively. It is calculated in analogy to the solar absorbance, but with using a Planck spectrum at 300 K (26.85° C.). Typical values are 0.84 for the coverglass and 0.85 for the supporting structure. σ is the Stefan-Boltzmann constant of 5.67×10$^{-8}$ W/m$^2$K$^4$. The calculated temperature of a triple junction solar cell integrated into the photovoltaic assembly under direct AM0 illumination is therefore 42° C.

For the photovoltaic assembly with the dual junction solar cell, the wavelength dependent absorbance used for calculating the solar absorbance $\alpha_{cell}$ of the cell can be approximated by the external quantum efficiency of the pn junctions of the first and second subcells, which is >90% from 350 nm to 875 nm. Since the light reflecting element essentially reflects all incoming solar radiation beyond 875 nm back out of the cell, the integration can be performed from 350 nm to 875 nm and results in an αcell of 0.6. The calculated temperature of this dual junction solar cell integrated into photovoltaic assembly under direct AM0 illumination in space is then 12° C., i.e., 30° C. colder than the calculated temperature for the triple junction solar cell integrated into the photovoltaic assembly. In this assessment an efficiency close to 30% is also assumed for the dual junction cell. This will be justified in the following.

Since the efficiency of solar cells decreases with increasing temperature, mainly driven by a decreasing open circuit voltage with increasing temperature, the reduced operating temperature under AM0 illumination results in a more efficient operation of the first and second subcells in the photovoltaic assembly. In good approximation, each junction has a temperature coefficient of −2 mV/K. The known photovoltaic assembly with the triple junction cell thus loses 17*3*2 mV=102 mV in open circuit voltage by going from the room temperature of 25° C. as a reference temperature to the operating temperature of 42° C. The photovoltaic assembly with the dual junction solar cell according to the present invention, on the other hand, gains 2*2*13 mV=52 mV from room temperature to the operating temperature of 12° C.

So, effectively, the photovoltaic assembly 110 according to the present invention gains 154 mV in comparison to the state of the art photovoltaic assembly 10 due to this temperature effect. By removing the Ge substrate in solar cell 114 of the photovoltaic assembly 110, the voltage contribution of the pn junction of the third subcell of app. 250 mV to the overall performance is lost, making the solar cell under reference conditions of 25° C. and 1 AM0 solar constant 10% relative less efficient. The temperature effect on the open circuit voltage, however, reduces this deficit to 96 mV. In relation to the open circuit voltage of approximately 2600 mV of the known assembly, the solar cell of the photovoltaic assembly has a voltage deficit of only 3.6%. This translates into an efficiency of close to 29%, instead of 30% for the known device.

Summarizing, the dual junction solar cell 114 with the light reflecting structure 140 adjacent to a rear side of the second subcell 130 is cheaper in production due to the removing of the growth substrate, which can be an already used growth substrate from a preceding deposition process and which can be re-used in a subsequent deposition process, and due to the simple structure of the cell allowing a deposition of the layers at high deposition rates, while ensuring a high solar cell efficiency when used in space.

In a second embodiment of the present invention, the dual junction solar cell 114 comprises a light reflecting element 142 that is configured to reflect photons having an energy larger than the bandgap energy of the light absorbing layer 136 of the second subcell 130 with a reflectivity of at least 90%, preferably at least 95% and more preferably at least 99%. In particular, the light reflecting element 142 is configured to reflect photons in the spectral sensitivity of the light absorbing layer 136 of the second subcell 130. In the example of the GaAs layer as the light absorbing layer 136 in the second subcell 130, the light reflecting element 142 is configured to reflect light with a wavelength in the range from 650 nm to 875 nm with a sufficiently high reflectivity of at least 90%, and preferably at least 95% or at least 99%.

This aspect may be an alternative aspect, which is independently protectable, or an additional aspect to the above described aspect that the dual junction solar cell 114 comprises a light reflecting element 140 which is configured to reflect photons having an energy smaller than the bandgap energy of the light absorbing layer of the second subcell. In other words, the dual junction solar cell may comprise a light reflecting element 140, 142 that is configured to reflect photons having an energy smaller than the bandgap energy of the light absorbing layer of the second subcell as well as photons having an energy larger than the bandgap energy of the light absorbing layer. This may be realized by the same light reflecting element 140 or 142 or two different light reflecting elements 140, 142. Or, alternatively, the dual junction solar cell 114 may comprise a light reflecting element 142 that is configured to reflect photons having an energy larger than the bandgap energy of the light absorbing layer of the second subcell without having a (same or other) light reflecting element 140 that is configured to reflect photons having an energy smaller than the bandgap energy of the light absorbing layer of the second subcell.

As the light reflecting element 142, a suitable planar metallic layer acting as a metallic mirror may be provided, as in the first embodiment. Specifically, in an embodiment, the same metallic layer may be configured to reflect photons having an energy larger and having an energy smaller than the bandgap energy of the light absorbing layer 136 of the second subcell 130. This may be, for example, achieved by means of a, Au layer. Also an Ag silver layer is suitable to both reflect photons having an energy larger and having an energy smaller than the bandgap energy of the light absorbing layer 136 of the second subcell 130 with a sufficiently high reflectivity. In another embodiment, the light reflecting element 142 may be also a dual layer structure (or multi-layer structure) comprising two (or more) different metal layers stacked on each other.

Thus, the simple light reflecting structure 142 according to the present invention can accomplish the same function as the known complex reflecting structure on the rear side of the second subcell, i.e., between the third and second subcells, of the known triple junction solar cell. In particular, the reflecting structure 142 is configured so as to be reflective for light that may be absorbed by the second subcell 130, thereby allowing non-absorbed photons to again pass the second subcell 130 and being absorbed. In that way, the thickness of the second subcell 130 may be reduced while still allowing the same number of photons to be absorbed. Reducing the thickness results in an enhanced radiation hardness in space. Specifically, for the application in space, also the efficiency after exposing the solar cell to a mission relevant does of energetic particles, in particular protons and electrons, the so called end of life efficiency, is of importance. Particle radiation decreases the diffusion length of the minority carriers and thereby determines the maximum distance from the pn junction where charge carriers are collected. If the absorbance of the cell can be increased by allowing the light to pass a second time through the cell, the cell thickness and thus the distance between the pn junction and the emitter can be reduced while still absorbing the same number of photons.

Thus, in a preferred embodiment, the same radiation hardness by the complex light reflecting structure as for example the Bragg reflector can be achieved by means of a much simpler structure. In addition, the broader the wavelength range is over which a Bragg reflector is capable to achieve high reflectivity, the more layers are needed in the Bragg stack. Therefore, implemented Bragg reflectors are usually focused on the long wavelength part, which is absorbed the weakest in the second subcell. The light reflecting element according to this invention does not suffer from these limitations.

According to a further implementation, the light reflecting element at the rear side of the second subcell is not a planar light reflecting element but a structured light reflecting element 144, in particular a micro structured element, which is configured to reflect light that may be absorbed by the second subcell 130 with a reflectivity of at least 90%. The structured light reflecting element 144 covering the overall rear surface of the second subcell 130 may comprise a plurality of three-dimensionally structured backreflecting elements. The three-dimensionally structured backreflecting elements may be regularly spaced and each may have the same shaping. The structured light reflecting element 144 is configured to reflect normally incident light of a specific wavelength or wavelength range within the wavelength band of light absorbable by the second subcell at an off-normal angle. This increases the distance travelled through the second subcell compared to a reflection at a normal angle and thus the probability of being absorbed in the second subcell. If the off-normal angle is additionally chosen so that the reflected light is totally reflected at the front surface of the photovoltaic assembly 110, the back-reflected light from the light reflecting layer 144 can be once again back reflected into the solar cell 114 at the front surface of the photovoltaic assembly 110 so as to have a third pass through the second subcell 130 for being absorbed (after having passed the first subcell 128, which is transparent for the light having an energy in the bandgap range of the second subcell 130), and if not absorbed, to even have a fourth pass through the second subcell 130 after reflection at the rear light reflecting element 144, allowing for efficient light trapping. Depending on the design of the backreflectors, even more paths through the solar cell are possible, still further increasing the absorption. Thus, full or almost full light absorption may be achieved for very thin second subcells 130, thereby increasing radiation hardness of the subcell 130 material beyond the radiation hardness of known triple junction solar cells comprising the Bragg reflector.

To achieve total reflection at the front surface, the off-normal angle at which the light is reflected at the rear, structured light reflecting element has to be larger than the critical angle θ of total reflection at the respective interface, i.e., outside of the escape cone of the respective interface of the photovoltaic assembly 110. Furthermore, it is advantageous to optimize the structured light reflecting element 144 for a wavelength close to the bandedge of the second, lower subcell 130, since light of this part of the spectrum is absorbed the least. Thus, for GaAs the chosen wavelength is approximately 875 nm. Optimizing the structured light reflecting element 144 for a particular wavelength may be achieved by a suitable material for the light reflecting element 144, in particular by a suitable metal. In particular, for having a reflection close to the bandedge of a GaAs subcell, Ag or Au is a suitable metal.

The angle of the escape cone is given by the critical angle θ of total reflection at the interfaces of the individual layers of the photovoltaic assembly 110. The critical angle θ of total reflection may be determined based on the following formula:

$$\theta = \arcsin\left(\frac{n_1}{n_2}\right),$$

wherein $n_1$ and $n_2$ are the refractive indices of the medium in which the light propagates and of the medium at the interface of which the light is reflected, respectively.

In the photovoltaic assembly 110 of FIG. 2, typical refractive indices are n=1.24 for the anti-reflective coating 124 on the front coverglass 122, n=1.54 for the front coverglass 122, n=1.42 for the adhesive 120 bonding the front coverglass 122 to the solar cell stack 114, n=2 for a first, outer layer of the anti-reflection coating 126 on the solar cell stack 114, n=2.4 for a second, inner layer of the anti-reflection coating 126 on the solar cell stack 114 and n=3.0 for the solar cell stack 114 (i.e., first subcell 128 of the solar cell stack 114). For this exemplary photovoltaic assembly 110, the refractive indices at the interfaces, calculated in accordance with the above formula, are 53° at the solar cell stack/anti-reflection coating (second, inner layer) interface, 56° at the interface between the two layers of the anti-reflection coating, 45° at the anti-reflection coating (first, outer layer)/adhesive for the coverglass interface, 54° at the coverglass/anti-reflective coating on the coverglass interface and 54° at the anti-reflective coating/vacuum or air (n=1) interface.

Thus, the smallest angle for the total reflection exists at the interface from the anti-reflective coating 126 on the cell stack 114 to the adhesive 120 for bonding the coverglass 122. To make use of the total reflection at this interface, a light reflecting element 144 has to be provided which is configured to reflect normally incident light at an angle greater than 45°.

An example for a structured light reflecting element 144 may be an asymmetric reflection grating, for example a blazed grating, which is particularly suitable for efficient light trapping, since also the light totally reflected from the front surface will again be reflected from the rear side outside the escape cone.

Blazed gratings are one dimensional, periodic structures, consisting of individual prisms (seen in cross section) of height h and base length d. The angle α of the reflected light relative to the normal in the diffraction order n is given as $$\alpha = \arctan\left(n\frac{\lambda}{d}\right)$$

for a given wavelength λ.

Focusing on the first order of diffraction n=1 and the condition that α needs to be outside the escape cone of the radiation defined by the angle θ=45°, the base length d of the blazed grating results as $$d = \frac{(1 * 875 \text{ nm})}{\tan(45°)}$$

for the example when light having a wavelength λ=875 nm is intended to be totally reflected at the front surface of the photovoltaic assembly.

The height h of the grating is calculated as $$h = \frac{n\lambda}{2}$$

so, in this case, h=438 nm.

For operation in space, the light is normally incident which provides ideal conditions for using solar cells with any of these described light management structures.

There are also unavoidable seasonal variations, for example during summer and winter solstice in earth orbit, where the angle of incidence reaches +/−23.5° due to the tilt of the earth rotation axis relative to the ecliptic. In these situations, it is preferred to align the blazed grating such that the steps of the blazed grating are parallel to the projection of the incident light (seen as a vector) into the plane of the solar cell.

In the following, a preferred method for manufacturing a dual junction solar cell 114 shall be described. The method is configured to manufacture each of the above described dual junction solar cells 114.

The method comprises the step of providing a semiconductor substrate. The semiconductor substrate is preferably a crystalline semiconductor substrate. The crystalline semiconductor substrate may be for example a Ge wafer or a GaAs wafer. Furthermore, the provided semiconductor substrate may be an already used semiconductor substrate, which has already been used as a growth substrate in a preceding manufacturing process of another dual junction solar cell, and which is re-used for this manufacturing process. Before re-using the substrate, simple surface preparation steps of the substrate have been performed, such as a chemical and optionally a mechanical polishing step.

In subsequent steps, a first subcell 128 having a light absorbing layer 134 is deposited on the semiconductor substrate, and a second subcell 130 having a light absorbing layer 136 is deposited on the first subcell 128. The light absorbing layer 134 of the first subcell 128 has a larger bandgap than the light absorbing layer 136 of the second subcell 130. Thus, the solar cell stack is deposited in a reverse order, beginning with the first subcell 128 which will be adjacent to the front, light-receiving surface of the manufactured dual junction solar cell 114.

The method also comprises the step of depositing or providing a light reflecting element 140, 142, 144 adjacent to a rear side of the light absorbing layer 136 of the second subcell 130 which is configured to reflect photons having an energy smaller than the bandgap energy of the light absorbing layer 136 of the second subcell 130 with a reflectivity of at least 90%, preferably at least 95%, and more preferably at least 99%, and/or configured to reflect photons having an energy larger than the bandgap energy of the light absorbing layer 136 of the second subcell 130 and smaller than the bandgap energy of the light absorbing layer 134 of the first subcell 128 with a reflectivity of at least 90%, preferably at least 95%, and more preferably at least 99%.

This step may form part of the step of depositing a second subcell 130. Thus, the light reflecting element 140, 142, 144 may form part of the second subcell 130. In the alternative, the light reflecting element 140, 142, 144 may be provided or deposited adjacent or on an exterior rear surface of the second subcell 130. In particular, the light reflecting element 140, 142, 144 may be provided so as to be located at any of the possible positions within the dual junction solar cell 114 as described with respect to the different embodiments of the dual junction solar cell 114 above.

The light reflecting element 140, 142, 144 may be a light reflecting layer. In particular, the light reflecting element which is configured to reflect photons having an energy smaller than the bandgap energy of the light absorbing layer of the second subcell with a reflectivity of at least 90%, preferably at least 95%, and more preferably at least 99%, may be formed so as to have any of the configurations as described above with respect to the different embodiments of the dual junction solar cell according to the first aspect. The light reflecting element which is configured to reflect photons having an energy larger than the bandgap energy of the light absorbing layer of the second subcell and smaller than the bandgap energy of the light absorbing layer of the first subcell with a reflectivity of at least 90%, preferably at least 95%, and more preferably at least 99%, may be formed so as to have any of the configurations as described above with respect to the different embodiments of the dual junction solar cell according to the second aspect.

A handle layer, in particular a thermal expansion matched handle layer, may be deposited on the rear side of the second subcell, in particular on the rear side of the light reflecting element in order to mechanically stabilize the solar cell stack. The handle layer may be for example Ni or Ni/Cu layer and may have a thickness of 5 µm to 20 µm.

After that, the semiconductor substrate is removed from the first subcell. Removing the semiconductor substrate may be performed by any methods already known from the prior art.

In particular, the semiconductor substrate may be removed by an epitaxial liftoff process, where a thin, sacrificial layer, for example AlAs, is included in the structure between wafer and epitaxy which is preferentially etched with high selectivity through suitable etchants like hydrofluoric acid (cf., References (1) and (2)).

In the alternative, the semiconductor substrate may be removed by spalling. Specifically, by depositing a dedicated stressor layer on top of the epitaxy a stress field is created within the crystal. By tuning the stress and the thickness of the stressor layer, a crack can be initiated, which propagates parallel to the surface of the substrate (cf, Reference (3)).

The semiconductor substrate may be also removed by "smart-cut", where H or He ions of a fixed energy are implanted. They accumulate at a fixed depth—governed by the implantation energy—and form gas bubbles within the crystal. Thermal annealing drives the individual bubbles to coalesce and horizontally separates the substrate at a given depth (cf, References (4) and (5)).

Another possible method for removing the semiconductor substrate is by using a monolayer of graphene between the growth substrate which has been shown to serve as a dedicated separation layer, while still enabling epitaxial growth on top (cf., Reference (6)).

An alternative concept for removing the substrate is "germanium on nothing". In this concept, an ordered array of cylindrical pores is etched into the wafer. An annealing step under hydrogen atmosphere transforms these pores into spherical voids underneath a homogeneous Ge layer which forms on top. This structure can be used as a growth template, with the spherical voids serving as a separation interface (cf, Reference (7)).

Since the dual junction solar cell is grown in a reverse order, i.e., starting with the front side solar cell, the handle layer can be deposited on the cell structure while still being on the growth substrate. No additional temporary handle needs to be applied in this case for the removal of the growth substrate, thereby simplifying process steps. In contrast, if the solar cell was grown upright with the second subcell directly on the growth substrate, a temporary handle has to be applied on the first subcell. When the epitaxy is removed from the growth substrate, the rear side metal is applied on the second subcell, and then the handle has to be removed again.

The removed semiconductor substrate may be re-used as a growth substrate in a subsequent process for manufacturing a dual junction solar cell. This leads to a significant reduction in production costs. The cost of the solar cell accounts for more than 90% of the cost of the photovoltaic assembly, wherein the growth substrate accounts for approximately ⅓ of the total solar cell cost when considering conventional triple junction solar cells.

In addition, the epitaxial layers of the dual junction solar cell may be grown at high deposition rates, due to the relatively simple structure of the dual junction solar cell without a complex Bragg reflector. In particular, the epitaxial layers of the first subcell and the second subcell and optionally also the light reflecting layer may be deposited with a deposition rate of 1 µm/h to 300 µm/h, in particular of 5 µm/h to 300 µm/h, and in particular of 10 µm/h to 300 µm/h by MOVPE or HVPE. Typical growth rates are about 1 µm/h.

The higher deposition rate leads to a further significant reduction in production costs, since the epitaxial growth accounts for another ⅓ of the total solar cell cost when considering conventional triple junction solar cells.

It is practicable to use high growth rates from 1 µm/h to 300 µm/h, as has been demonstrated in prior art literature, both with MOVPE and HVPE (cf., References (8) and (9)).

In order to avoid that the heating up and cooling down cycles for the wafers from room temperature to the growth temperatures of 600-700° C. becomes the rate limiting step in this scenario, wafer removal from the reactor/growth system at elevated temperatures is required. With current robotic technology the wafers can be already removed at 400° C. HVPE growth requires more complex growth systems, but has additional cost saving potential, since the group III precursors are produced in-situ by reacting the liquid group III metals with an HCl gas flow.

In sum, the manufacturing costs of the photovoltaic assembly according to the present invention are reduced by about 50% compared to the manufacturing costs of the photovoltaic assembly including the conventional triple junction solar cell, while ensuring by the light management features according to the present invention that the efficiency of the photovoltaic assembly according to the present invention is the same or approximately the same when used in space as that of the conventional photovoltaic assembly.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF CITED REFERENCES

Reference (1): Eli Yablonovitch, T. Gmitter, J. P. Harbison, and R. Bhat, "Extreme selectivity in the lift-off of epitaxial GaAs films", Appl. Phys. Lett. 51, 2222 (1987); https://doi.org/10.1063/1.98946;

Reference (2): Schermer, J. J., Mulder, P., Bauhuis, G. J., Voncken, M. M., van Deelen, J., Haverkamp, E. and Larsen, P. K. (2005), "Epitaxial Lift-Off for large area thin film III/V devices"; phys. stat. sol. (a), 202: 501-508; doi:10.1002/pssa.200460410

Reference (3): S. W. Bedell et al., "Kerf-Less Removal of Si, Ge, and III-V Layers by Controlled Spalling to Enable Low-Cost PV Technologies," in IEEE Journal of Photovoltaics, vol. 2, no. 2, pp. 141-147, April 2012; doi: 10.1109/JPHOTOV.2012.2184267;

Reference (4): Michel Bruel, Bernard Aspar and Andre-Jacques Auberton-Hervé, Smart-Cut: A New Silicon On Insulator Material Technology Based on Hydrogen Implantation and Wafer Bonding. Japanese Journal of Applied Physics, Volume 36, Part 1, Number 3B;

Reference (5): C. Deguet et al., "Germanium-on-insulator (GeOI) structures realized by the Smart Cut/sp1trade/ technology," 2004 IEEE International SOI Conference (IEEE Cat. No. 04CH37573), Charleston, SC, USA, 2004, pp. 96-97; doi: 10.1109/SOI.2004.1391571;

Reference (6): Yunjo Kim, et al, "Remote epitaxy through graphene enables two-dimensional material-based layer transfer", Nature 544, 340-343, 2017;

Reference (7): Sanghyun Park, John Simon, Kevin L. Schulte, Aaron J. Ptak, Jung-Sub Wi, David L. Young, Jihun Oh, "Germanium-on-Nothing for Epitaxial Liftoff of GaAs Solar Cells", Joule 7, 1782-1793, 2019;

Reference (8): R. Lang, J. Scholl, F. Dimroth and D. Lackner, "Optimization of GaAs Solar Cell Performance and Growth Efficiency at MOVPE Growth Rates of 100 µm/h," in IEEE Journal of Photovoltaics, vol. 8, no. 6, pp. 1596-1600, Nov. 2018; doi: 10.1109/JPHOTOV.2018.2868021;

Reference (9): Metaferia, W., Schulte, K. L., Simon, J. et al., "Gallium arsenide solar cells grown at rates exceeding 300 µm h-1 by hydride vapor phase epitaxy"; Nat Commun 10, 3361 (2019); doi:10.1038/s41467-019-11341-3.

The invention claimed is:

1. A dual junction solar cell for a photovoltaic assembly for space use, comprising
a solar cell stack comprising first and second subcells stacked on each other and each comprising an epitaxially grown light absorbing layer, the first subcell being adjacent to a front, light-receiving surface of the solar cell stack and the second subcell being adjacent to a rear surface of the solar cell stack, and the light absorbing layer of the first subcell having a larger bandgap than the light absorbing layer of the second subcell,
a rear side contact layer, and
a light reflecting element between the light absorbing layer of the second subcell and the rear side contact layer, wherein the light reflecting element is configured to reflect photons having an energy smaller than the bandgap energy of the light absorbing layer of the second subcell with a reflectivity of at least 90%.

2. The dual junction solar cell of claim 1, wherein the light reflecting element is configured to reflect photons having an energy larger than the bandgap energy of the light absorbing layer of the second subcell with a reflectivity of at least 90%.

3. The dual junction solar cell of claim 1, wherein the light reflecting element is configured to reflect photons having an energy larger than the bandgap energy of the light absorbing layer of the second subcell and smaller than the bandgap energy of the light absorbing layer of the first subcell with a reflectivity of at least 90%.

4. The dual junction solar cell of claim 1, wherein the light reflecting element is metal layer.

5. The dual junction solar cell of claim 4, wherein the light reflecting element is a planar metal layer.

6. A dual junction solar cell for a photovoltaic assembly for space use, comprising
a solar cell stack comprising first and second subcells stacked on each other and each comprising an epitaxially grown light absorbing layer, the first subcell being adjacent to a front, light-receiving surface of the solar cell stack and the second subcell being adjacent to a rear surface of the solar cell stack, and the light absorbing layer of the first subcell having a larger bandgap than the light absorbing layer of the second subcell,
a rear side contact layer, and
a light reflecting element between the light absorbing layer of the second subcell and the rear side contact layer, wherein the light reflecting element has a planar reflecting surface and is configured to reflect photons having an energy larger than the bandgap energy of the light absorbing layer of the second subcell and smaller than the bandgap energy of the light absorbing layer of the first subcell with a reflectivity of at least 90%.

7. The dual junction solar cell of claim 1, wherein the light absorbing layer of the first subcell comprises GaInP, and the light absorbing layer of the second subcell comprises GaInAs or GaAs.

8. The dual junction solar cell of claim 6, wherein the light absorbing layer of the first subcell comprises GaInP, and the light absorbing layer of the second subcell comprises GaInAs or GaAs.

9. A photovoltaic assembly for space use comprising
a plurality of dual junction solar cells as defined in claim 1 arranged in a two-dimensional array and electrically connected to each other,
a support structure carrying the two-dimensional array of dual junction solar cells, and
a covering assembly covering a light receiving side of the two-dimensional array.

10. A photovoltaic assembly for space use comprising
a plurality of dual junction solar cells as defined in claim 6 arranged in a two-dimensional array and electrically connected to each other, a support structure carrying the two-dimensional array of dual junction solar cells, and a covering assembly covering a light receiving side of the two-dimensional array.

11. A satellite comprising a photovoltaic assembly of claim 9.

12. A method for manufacturing a dual junction solar cell, comprising providing a semiconductor substrate, depositing a first subcell having a light absorbing layer on the semiconductor substrate, depositing a second subcell having a light absorbing layer on the first subcell, wherein the light absorbing layer of the first subcell has a larger bandgap than the light absorbing layer of the second subcell, depositing or providing a light reflecting element adjacent to a rear side of the light absorbing layer of the second subcell, providing a rear side contact layer adjacent to a rear side of the light reflecting element, wherein the light reflecting element is at least one of configured to reflect photons having an energy smaller than the bandgap energy of the light absorbing layer of the second subcell with a reflectivity of at least 90%, or configured to reflect photons having an energy larger than the bandgap energy of the light absorbing layer of the second subcell and smaller than the bandgap energy of the light absorbing layer of the first subcell with a reflectivity of at least 90% and configured to have a planar reflecting surface, and removing the semiconductor substrate from the first subcell.

13. The method of claim 12, wherein the step of providing the semiconductor substrate includes removing the semiconductor substrate from another first subcell during manufacturing of another dual junction solar cell and reusing the removed semiconductor substrate.

* * * * *